US012794221B2

(12) United States Patent
Chang et al.

(10) Patent No.: US 12,794,221 B2
(45) **Date of Patent: *Nov. 10, 2026**

(54) POWER CLAMP DEVICE

(71) Applicant: TAIWAN SEMICONDUCTOR MANUFACTURING COMPANY LTD., Hsinchu (TW)

(72) Inventors: Pin-Hsin Chang, Taichung City (TW); Hsin-Yu Chen, Hsinchu City (TW); Tzu-Heng Chang, New Taipei City (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 191 days.

This patent is subject to a terminal disclaimer.

(21) Appl. No.: 18/755,747

(22) Filed: Jun. 27, 2024

(65) Prior Publication Data

US 2024/0348044 A1 Oct. 17, 2024

Related U.S. Application Data

(63) Continuation of application No. 17/810,602, filed on Jul. 3, 2022, now Pat. No. 12,068,597.

(51) Int. Cl.

| | |
|---|---|
| ***H02H 9/00*** | (2006.01) |
| ***H03K 5/13*** | (2014.01) |
| *H03K 5/00* | (2006.01) |

(52) U.S. Cl.

CPC ............... *H02H 9/005* (2013.01); *H03K 5/13* (2013.01); *H03K 2005/00195* (2013.01)

(58) Field of Classification Search

CPC ............ H02H 9/04; H02H 9/00; H02H 9/005; H02H 9/041; H02H 9/043; H02H 9/046; H01L 29/78; H01L 29/73; H01L 27/02; H03K 2005/00195

USPC ............................................................ 361/56

See application file for complete search history.

(56) References Cited

U.S. PATENT DOCUMENTS

| | | | | |
|---|---|---|---|---|
| 12,068,597 | B2 * | 8/2024 | Chang | H03K 5/13 |
| 2006/0274466 | A1 * | 12/2006 | Rice | H10D 89/811 361/56 |
| 2007/0171587 | A1 * | 7/2007 | Lee | H10D 89/819 361/56 |
| 2009/0086392 | A1 * | 4/2009 | Ker | H02H 9/046 361/56 |
| 2015/0077890 | A1 * | 3/2015 | Ozawa | H02H 9/046 361/56 |

(Continued)

*Primary Examiner* — Danny Nguyen

(74) *Attorney, Agent, or Firm* — WPAT LAW; Anthony King

(57) ABSTRACT

The present disclosure provides a power clamp device. The power clamp device includes a delay element, a first transistor, a second transistor, and a gate control circuit. The delay element has an input terminal and an output terminal. The first transistor has a gate electrically connected to the output terminal of the delay element. The second transistor has a source electrically connected to a drain of the first transistor. The gate control circuit has a first terminal electrically connected to the input terminal of the delay element, a second terminal electrically connected to the output terminal of the delay element, and a third terminal electrically connected to a gate of the second transistor.

20 Claims, 10 Drawing Sheets

(56) References Cited

U.S. PATENT DOCUMENTS

| | | | | |
|---|---|---|---|---|
| 2015/0229125 | A1* | 8/2015 | Kato | H02H 9/046 361/56 |
| 2018/0083443 | A1* | 3/2018 | Mertens | H10D 89/819 |

* cited by examiner

310

POWER CLAMP DEVICE

PRIORITY CLAIM AND CROSS-REFERENCE

This application is a continuation application of prior-filed U.S. application Ser. No. 17/810,602, filed Jul. 3, 2022, the contents of which are incorporated herein by reference in its entirety.

TECHNICAL FIELD

The disclosure relates to a power clamp device, and, more particularly, to a power clamp device for electrostatic discharge (ESD) protection.

BACKGROUND

ESD induced electrical overstress (EOS) is a reliability issue in any kind of circuit design. Power clamp devices are used to discharge (or bypass) the ESD current to avoid damaging the main circuit. Therefore, improving the performance of power clamp devices has become an important area of research.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
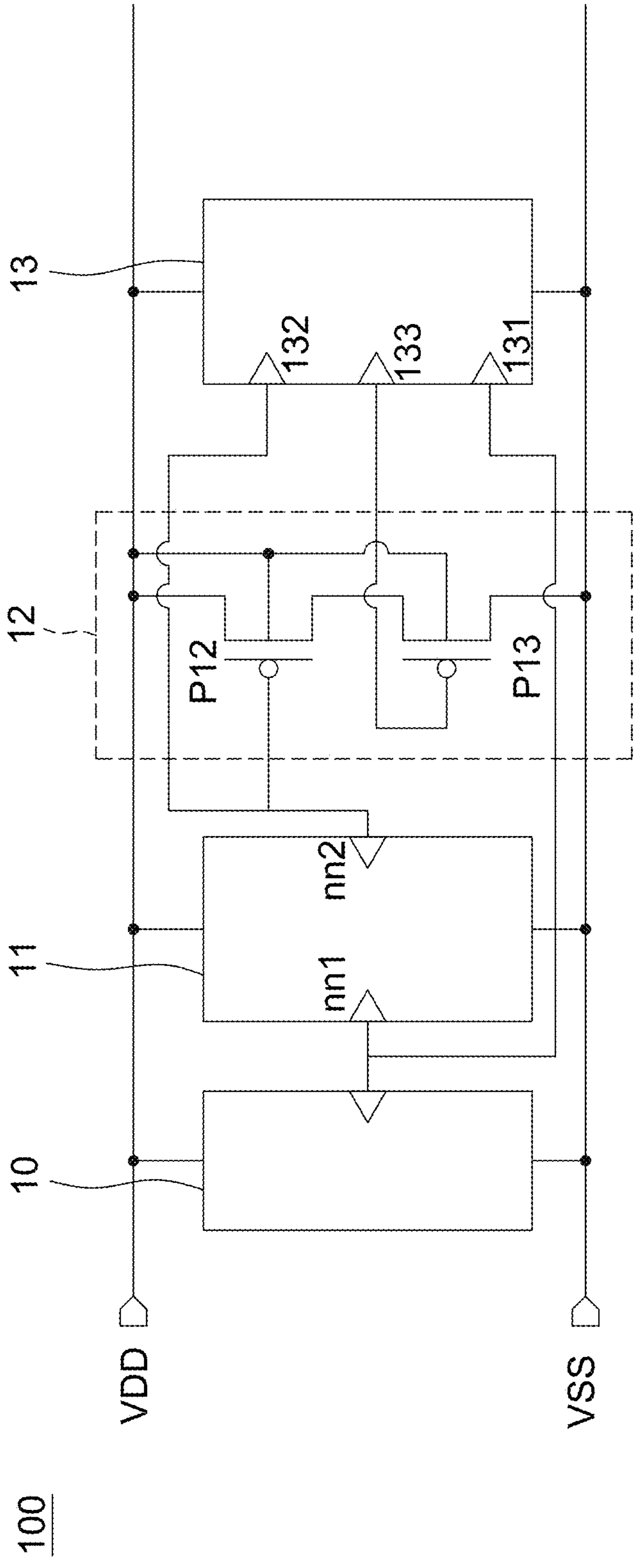
FIG. 1 is a schematic diagram of a power clamp device in accordance with some embodiments of the present disclosure.

The following disclosure provides many different embodiments, or examples, for implementing different features of the provided subject matter. Specific examples of components and arrangements are as follows to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Further, it is understood that several processing steps and/or features of a device may be only briefly described. Also, additional processing steps and/or features can be added, and certain of the following processing steps and/or features can be removed or changed while still implementing the claims. Thus, the following description should be understood to represent examples only, and are not intended to suggest that one or more steps or features is required.

In addition, the present disclosure may repeat reference numerals and/or letters in the various examples. This repetition is for the purpose of simplicity and clarity and does not in itself dictate a relationship between the various embodiments and/or configurations discussed.

FIG. 1 is a schematic diagram of a power clamp device 100 in accordance with some embodiments of the present disclosure. The power clamp device 100 may be connected to internal circuits and configured to protect the internal circuits in the case that an ESD event occurs. In an ESD condition, the power clamp device 100 may be configured to clamp an ESD overstress voltage across power rails. The power clamp device 100 is biased by an ESD energy and provides a low-impedance path between power rails (e.g., a supply voltage VDD and a supply voltage VSS) to bypass an ESD current. The ESD current can be efficiently discharged through the power clamp device 100. In a normal operating condition (or in a normal power-on operation when the normal supply voltage VDD is applied on the internal circuits, e.g., no ESD event occurs), the power clamp device 100 is kept off or turned off to avoid any influence on the internal circuits.

As shown in FIG. 1, the power clamp device 100 includes a transient detector 10, a delay element 11, an ESD bypass element 12, and a gate control circuit 13. The transient detector 10, the delay element 11, the ESD bypass element 12, and the gate control circuit 13 are electrically connected between the power rails (e.g., the supply voltage VDD and the supply voltage VSS).

The transient detector 10 is electrically connected to delay element 11. The delay element 11 has an input terminal nn1 electrically connected to the transient detector 10 and an output terminal nn2 electrically connected to the ESD bypass element 12. The transient detector 10 and the delay element 11 are configured to detect an ESD event and control the ESD bypass element 12. The transient detector

10 and the delay element 11 are configured to turn on the ESD bypass element 12 under ESD overstress and turn off the ESD bypass element 12 under normal power-on conditions.

The ESD bypass element 12 includes a cascaded structure including a p-type transistor P12 and a p-type transistor P13. The transistor P12 may include a p-type MOSFET. The transistor P13 may include a p-type MOSFET. The transistor P12 and/or the transistor P13 may include a bipolar insulated gate field effect transistor (BIGFET). The transistor P12 has a gate electrically connected to the output terminal nn2 of the delay element 11, a source electrically connected to the supply voltage VDD, a drain electrically connected to a source of the transistor P13, and a bulk electrically connected to the supply voltage VDD. The transistor P13 has a gate electrically connected to the gate control circuit 13, the source electrically connected to the drain of the transistor P12, a drain electrically connected to supply voltage VSS, and a bulk electrically connected to the supply voltage VDD.

The ESD bypass element 12 is configured to clamp an ESD overstress voltage across power rails (i.e., the supply voltage VDD and the supply voltage VSS). The ESD bypass element 12 is biased by an ESD energy and provides a low-impedance path between the power rails (e.g., the supply voltage VDD and the supply voltage VSS) to bypass an ESD current. The ESD current can be efficiently discharged through the ESD bypass element 12.

The cascaded structure of the transistors P12 and P13 of the ESD bypass element 12 can reduce the standby leakage current in the normal operating conditions. For example, the cascaded structure can reduce the subthreshold leakage current of the ESD bypass element 12 due to the stack effect or self-reverse bias effect. In particular, a reverse bias across the source and the bulk of the transistor P13 can reduce the subthreshold leakage current. In some embodiments, the ESD bypass element 12 may include more transistors in a stack.

The gate control circuit 13 has a first terminal 131 electrically connected to the input terminal nn1 of the delay element 11, a second terminal 132 electrically connected to the output terminal nn2 of the delay element, and a third terminal 133 electrically connected to the gate of the transistor P13.

The delay element 12 and the gate control circuit 13 are configured to control the ESD bypass element 12. As shown in FIG. 1, the gate of the transistor P12 is driven by the output terminal nn2 of the delay element 12 and the gate of the transistor P13 is driven by the third terminal 133 of the gate control circuit 13.

When the transient detector 10 and the delay element 11 detect an ESD event, the delay element 11 turns on the transistor P12 of the ESD bypass element 12, and the gate control circuit 13, in response to the signal received by the first terminal 131 and the second terminal 132, generates a drive signal at the third terminal 133 and turns on the transistor P13 of the ESD bypass element 12. The turned-on transistors P12 and P13 of the ESD bypass element 12 provide a low-impedance path between the power rails (i.e., the supply voltage VDD and the supply voltage VSS. The transistor P12 and the transistor P13 are configured to discharge an ESD current between the supply voltage VDD and the supply voltage VSS. The ESD bypass element 12 is configured to clamp the ESD across the power rails. The power clamp device 100 can protect internal circuits from ESD damage.

In normal operating conditions, the delay element 11 turns off the transistor P12 of the ESD bypass element 12 by coupling the supply voltage VDD to the gate of the transistor P12. In the normal operating conditions, the gate control circuit 13, in response to the signals received by the first terminal 131 and the second terminal 132, turns off the transistor P13 of the ESD bypass element 12 by coupling a voltage or a potential different from the supply voltage VDD, but enough for turning off the transistor P13, from the third terminal 133 to the gate of the transistor P13. For example, the voltage at the gate of the transistor P13 is lower than the voltage at the gate of the transistor P12. The smaller voltage difference across the gate and the source of the transistor P13 further reduces the standby leakage, e.g., the subthreshold leakage current when the power clamp device 100 is kept off. The gate control circuit 13 optimizes the gate voltage (or the gate potential) to minimize the leakage current in normal power-on operation. The power consumption of the power clamp device 100 is thus improved with no sacrifice of the capacity of the discharge of the ESD current.

Figure 2:
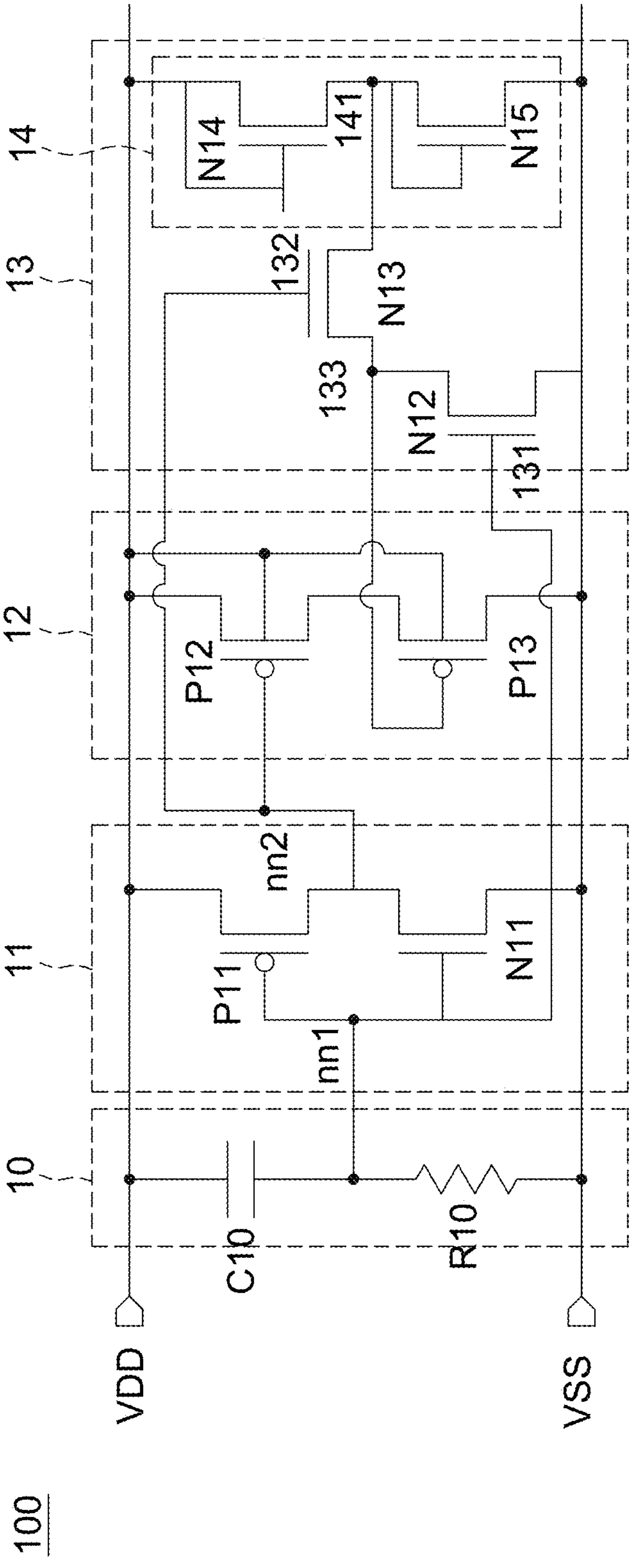
FIG. 2 is a schematic diagram of a power clamp device in accordance with some embodiments of the present disclosure.

FIG. 2 is a schematic diagram of the power clamp device 100 in accordance with some embodiments of the present disclosure. As shown in FIG. 2, the examples of the transient detector 10, the delay element 11, and the gate control circuit 13 are illustrated.

The transient detector 10 includes a resistor R10 and a capacitor C10. The resistor R10 is electrically connected to a supply voltage (or a reference voltage) VDD. The capacitor C10 is electrically connected to a supply voltage (or a reference voltage) VSS. The resistor R10 is electrically connected to the capacitor C10 at a node nn1. The resistor R10 may include a solder-mounted technology (SMT) resistor. The resistor R10 may include a transistor-based resistor. For example, the resistor R10 may include a diode-connected transistor. The capacitor C10 may include an SMT Capacitor. The capacitor C10 may include a transistor-based capacitor. The capacitor C10 may include a transistor having commonly tied source, drain, and bulk.

The delay element 11 has an input terminal nn1 and an output terminal nn2. The delay element 11 is electrically connected to the transient detector 10. The delay element is electrically connected to the supply voltage VDD and/or the supply voltage VSS. The delay element 11 includes an inverter including a p-type transistor P11 and an n-type transistor N11. The transistor P11 may include a p-type MOS field-effect transistor (FET). The transistor N11 may include an n-type MOSFET. The transistor P11 has a gate electrically connected to the node (or the input terminal) nn1, a source electrically connected to the supply voltage VDD, and a drain electrically connected to a drain of the transistor N11. The transistor N11 has a gate electrically connected to the node (or the input terminal) nn1, the drain electrically connected to the drain of the transistor P11, and a source electrically connected to the supply voltage VSS.

The delay element 11 may include more than one inverter having components similar to those of the transistors P11 and N11. The delay element 11 may be a buffer between the transient detector 10 and the ESD bypass element 12. The delay element may be configured to drive the bypass ESD element 12. In other words, the delay element may be configured to turn on or turn off the bypass ESD element 12. The delay element 11 may include other circuits that are capable of driving the bypass ESD element 12.

In the case that an ESD event occurs (i.e., an ESD condition), an ESD voltage across the supply voltage VDD and VSS will charge the capacitor C10 to change the voltage at the node (or the input terminal of the transient detector 10) nn1. In other words, the voltage at the node nn1 is coupled to the power rail VDD via the capacitor C10. As such, the transistor N11 of the delay element 11 is turned on and the voltage at the output terminal nn2 is forced to a lower voltage (e.g., the reference voltage VSS). The delay element 11 subsequently turns on the transistor P12 of the ESD bypass element 12. In the meantime, the gate control circuit 13 turns on the transistor P13 of the ESD bypass element 12 and a detailed discussion will be provided in the following paragraphs. The turned-on transistors P12 and P13 of the ESD bypass element 12 provide a low-impedance path between the power rails (i.e., the supply voltage VDD and the supply voltage VSS. The transistor P12 and the transistor P13 are configured to discharge an ESD current between the supply voltage VDD and the supply voltage VSS. The ESD bypass element 12 is configured to clamp the ESD across the power rails. The power clamp device 100 can protect internal circuits from ESD damage.

In normal operating conditions, the rise time of the normal voltage across the power rails is slower than an ESD voltage or pulse. As such, the transient detector 10 with a time constant (e.g., in the order of a microsecond) can follow the change of the normal voltage across the power rails in time. The transistor P11 of the delay element 11 is thus turned on to keep the voltage at the output terminal nn2 at a voltage of the supply voltage VDD to turn off the transistors P12 of the ESD bypass element 12. In the meantime, the gate control circuit 13 turns off the transistor P13 of the ESD bypass element 12 and a detailed discussion will be provided in the following paragraphs.

The gate control circuit 13 includes an n-type transistor N12, an n-type transistor N13, and a voltage ladder 14 electrically connected to the transistor N13. The transistor N12 may include an n-type MOSFET. The transistor N13 may include an n-type MOSFET. The transistor N12 has a gate which acts as the first terminal 131 electrically connected to the input terminal nn1 of the delay element 11, a source electrically connected to the supply voltage VSS, and a drain electrically connected to a source of the transistor N13 at the third terminal 133. The transistor N13 has a gate that acts as the second terminal 132 electrically connected to the output terminal nn2 of the delay element 11, the source electrically connected to the drain of the transistor N12, and a drain electrically connected to a terminal 141 of the voltage ladder 14. The drain of the transistor N12 and the source of the transistor N13 are electrically connected together with the gate of the transistor P13 of the ESD bypass element 12.

The voltage ladder 14 includes an n-type transistor N14 and an n-type transistor N15. The transistor N14 may include an n-type MOSFET. The transistor N15 may include an n-type MOSFET. The transistors N14 and N15 are diode-connected to act as a resistor. For example, the transistor N14 or N15 has a gate connected to a drain thereof. The transistor N14 has a source electrically connected to the drain of the transistor N15 at a node 141 of the voltage ladder 14. A voltage (or a reference voltage) of the node 141 of the voltage ladder 14 may depend on the ratio of the equivalent resistance of the transistors N14 and N15. For example, the voltage of the node 141 may equal $(VDD-VSS)*R_{N15}/(R_{N14}+R_{N15})$, wherein the $R_{N14}$ and $R_{N15}$ are the equivalent resistance of the transistors N14 and N15, respectively. In some embodiments, the voltage ladder 14 may have different components (e.g., a plurality of resistors) that fulfill the function of providing a reference voltage.

The gate control circuit 13 is configured to control the voltage of the gate of the transistor P13 via the connection between the third terminal 133 and the gate of the transistor P13.

As previously discussed, in the case that an ESD event occurs, the node (or the output terminal of the delay element 11) nn2 is forced to a lower voltage to turn on the transistor P12. In the meantime, the voltage at the input terminal nn1 is relatively high (e.g., coupled to the supply voltage VDD) to turn on the transistor N12 and the voltage of the output terminal nn2 is relatively low (e.g., coupled to the supply voltage VSS) to turn off the transistor N13 of the gate control circuit 13. The transistor N12 couples the third terminal to a lower voltage (e.g., the supply voltage VSS) which turns on the transistor P13. In the ESD condition (e.g., an ESD event occurs, the gate of the transistor P12 and the gate of the transistor P13 have the same potential. The turned-on transistors P12 and P13 of the ESD bypass element 12 provide a low-impedance path between the power rails (i.e., the supply voltage VDD and the supply voltage VSS. The ESD bypass element 12 is configured to clamp the ESD across the power rails. The power clamp device 100 can protect internal circuits from ESD damage.

In normal operating conditions, the voltage at the input terminal nn1 is relatively low (e.g., coupled to the supply voltage VSS) to turn off the transistor N12 and the voltage of the output terminal nn2 is relatively high (e.g., coupled to the supply voltage VDD) to turn on the transistor N13 of the gate control circuit 13. The turned-off transistor N12 acts as a resistor with a relatively large resistance. The voltage of the terminal 141 is forced to the third terminal 133 via the turned-on transistor N13. Because of the voltage ladder 14, the third terminal 133 is only coupled to the voltage at the terminal 141, rather than the supply voltage VDD. As such, in the normal operating condition (e.g., no ESD event occurs), the voltage at the gate of the transistor P13 is different from the voltage (i.e., the supply voltage VDD) at the gate of the transistor P12. For example, the voltage at the gate of the transistor P13 is lower than the voltage at the gate of the transistor P12. The smaller voltage difference across the gate and the source of the transistor P13 further reduces the standby leakage, e.g., the subthreshold leakage current when the power clamp device 100 is kept off. The gate control circuit 13 optimizes the gate voltage (or the gate potential) to minimize the leakage current in normal power-on operation. The power consumption of the power clamp device 100 is thus improved with no sacrifice of the capacity of the discharge of the ESD current.

Figure 3:
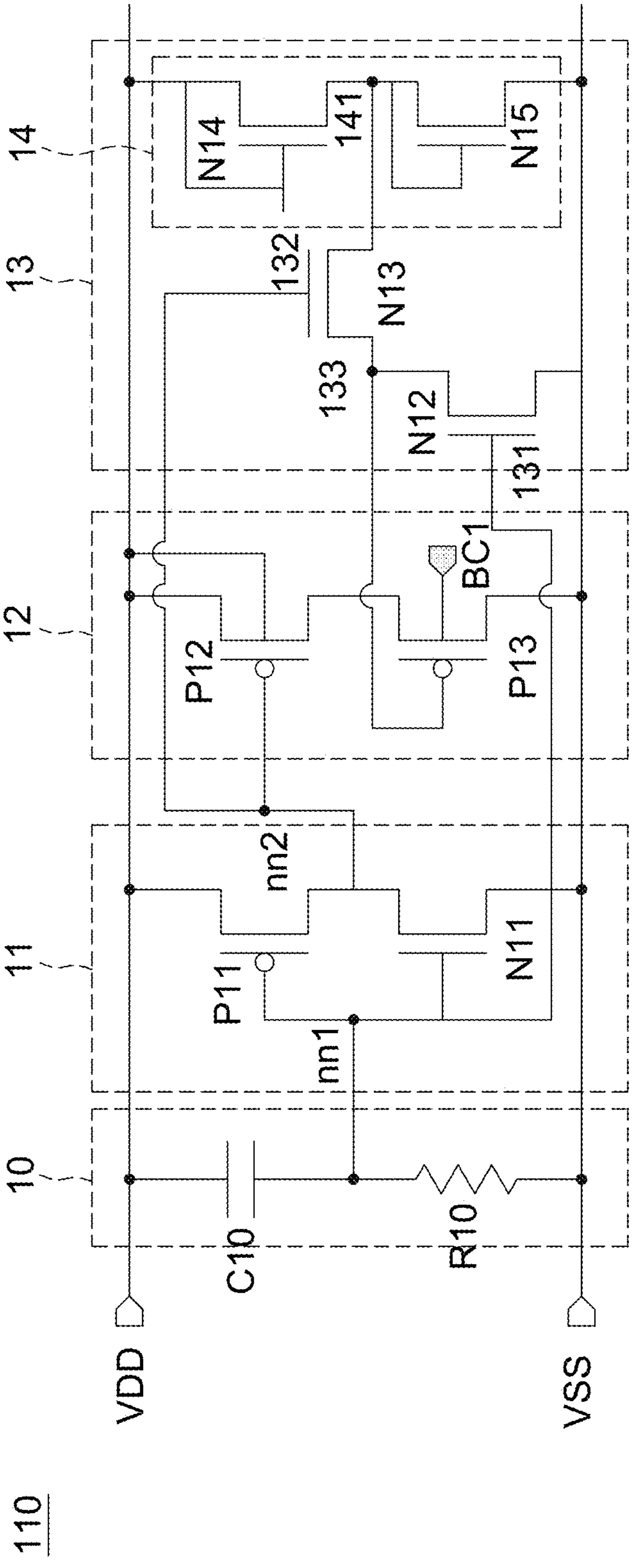
FIG. 3 is a schematic diagram of a power clamp device in accordance with some embodiments of the present disclosure.

FIG. 3 is a schematic diagram of a power clamp device 110 in accordance with some embodiments of the present disclosure. The power clamp device 110 of FIG. 3 is similar to the power clamp device 100 of FIG. 2. The difference therebetween will be discussed in detail.

The bulk of the transistor P13 of the ESD bypass element 12 is controlled by a bulk control signal BC1 transmitted by a bulk control circuit (not shown). In some embodiments, the power clamp device 110 may be formed in a silicon-on-insulator (SOI) substrate and a conductive pad on a backside surface of the SOI substrate may be connected to the bulk of the transistor P13. The bulk control signal BC1 may be biased on the conductive pad on the backside surface of the SOI substrate and transmitted to the bulk of the transistor P13. The bulk control signal BC1 can be set to increase the voltage difference across the source and the bulk of the transistor N13. For example, the bulk control signal BC1 may be larger than the supply voltage VDD. The bulk control signal BC1 enhances the self-reverse bias effect of the cascaded structure of the ESD bypass element 12. As such, the standby leakage of the power clamp device 110 can be further reduced.

Figure 4:
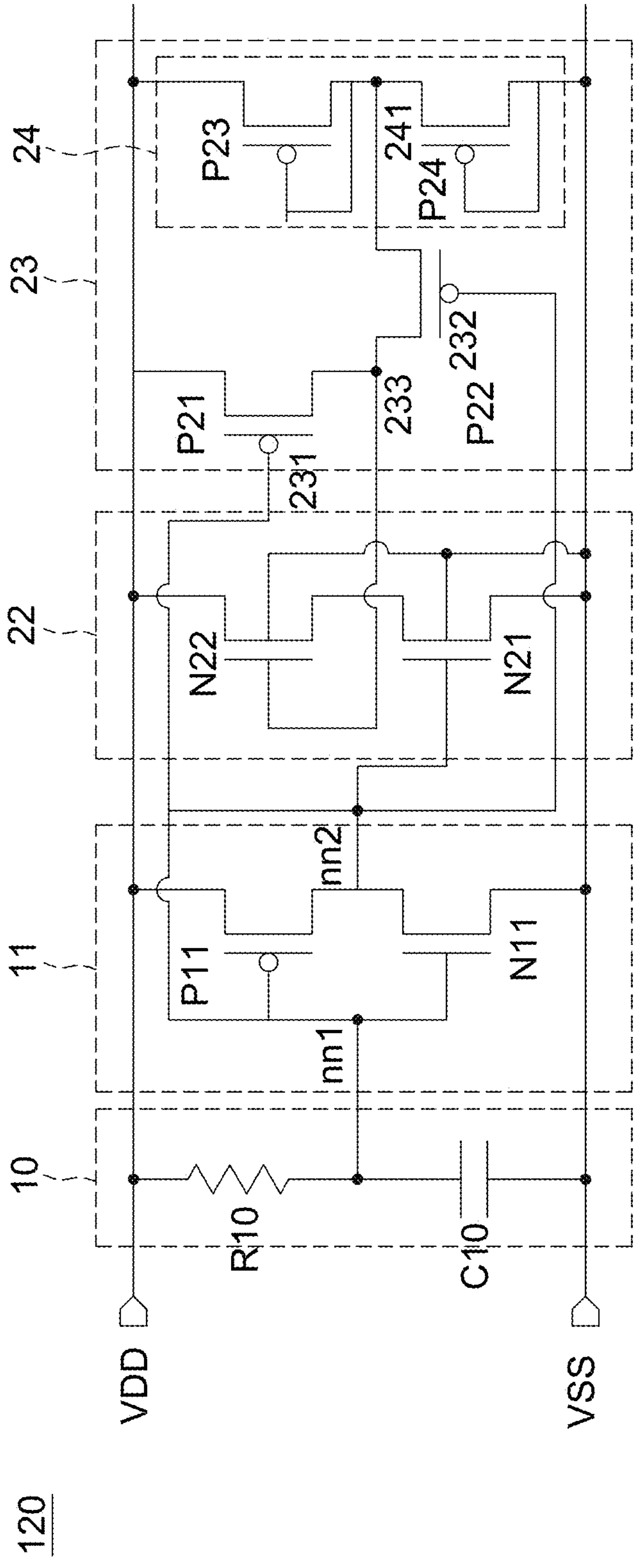
FIG. 4 is a schematic diagram of a power clamp device in accordance with some embodiments of the present disclosure.

FIG. 4 is a schematic diagram of a power clamp device 120 in accordance with some embodiments of the present disclosure. The power clamp device 120 includes the transient detector 10, the delay element 11, an ESD bypass element 22, and a gate control circuit 23. The transient detector 10 in FIG. 3 is similar to the transient detector 10 in FIG. 2, except that the arrangement of the resistor R10 and the capacitor C10 is switched, and the delay element 11 in FIG. 4 is the same as the delay element 11 in FIG. 2, and thus a detailed description thereof is omitted for brevity.

The ESD bypass element 22 includes a cascaded structure including an n-type transistor N21 and an n-type transistor N22. The transistor N21 may include an n-type MOSFET. The transistor N22 may include an n-type MOSFET. The transistor N21 and/or the transistor N22 may include a bipolar insulated gate field effect transistor (BIGFET). The transistor N21 has a gate electrically connected to the output terminal nn2 of the delay element 11, a source electrically connected to the supply voltage VSS, a drain electrically connected to a source of the transistor N22, and a bulk electrically connected to the supply voltage VSS. The transistor N22 has a gate electrically connected to the gate control circuit 23, the source electrically connected to the drain of the transistor N21, a drain electrically connected to supply voltage VDD, and a bulk electrically connected to the supply voltage VSS.

The ESD bypass element 22 is configured to clamp an ESD overstress voltage across power rails (i.e., the supply voltage VDD and the supply voltage VSS). The ESD bypass element 22 is biased by an ESD energy and provides a low-impedance path between the power rails to bypass an ESD current. The ESD current can be efficiently discharged through the ESD bypass element 22.

The gate control circuit 23 has a first terminal 231, a second terminal 232, and a third terminal 233. The gate control circuit 23 includes a p-type transistor P21, a p-type transistor P22, and a voltage ladder 24. The transistor P21 may include a p-type MOSFET. The transistor P22 may include a p-type MOSFET. The transistor P21 has a gate that acts as the first terminal 231 electrically connected to the input terminal nn1 of the delay element 11, a source electrically connected to the supply voltage VDD, and a drain electrically connected to a source of the transistor P22 at the third terminal 233. The transistor P22 has a gate that acts as the second terminal 232 electrically connected to the output terminal nn2 of the delay element 11, the source electrically connected to the drain of the transistor P21, and a drain electrically connected to a terminal (or a node) 241 of the voltage ladder 24. The drain of the transistor P21 and the source of the transistor P22 are electrically connected together with the gate of the transistor N22 of the ESD bypass element 22.

The voltage ladder 24 includes a p-type transistor P23 and a p-type transistor P24. The transistor P23 may include a p-type MOSFET. The transistor P24 may include a p-type MOSFET. The transistors P23 and P24 are diode-connected to act as a resistor. For example, the transistor P23 or P24 has a gate connected to a drain thereof. The transistor P24 has a source electrically connected to the drain of the transistor P23 at the node 241 of the voltage ladder 24. The voltage at the node 241 may depend on the ratio of the equivalent resistance of the transistors P23 and P24. For example, the voltage of the node 141 may equal $(VDD-VSS)*R_{P24}/(R_{P23}+R_{P24})$, wherein the $R_{P23}$ and $R_{P24}$ are the equivalent resistance of the transistors P23 and P24, respectively.

The gate control circuit 23 is configured to control the voltage of the gate of the transistor N22 via the connection between the third terminal 233 and the gate of the transistor N22.

In the case that an ESD event occurs (or the ESD condition), the node (or the output terminal of the delay element 11) nn2 is forced to a higher voltage (e.g., the supply voltage VDD) to turn on the transistor N21. In the meantime, the voltage at the input terminal nn1 is relatively low (e.g., coupled to the supply voltage VSS) to turn on the transistor P21 and the voltage of the output terminal nn2 is relatively high (e.g., coupled to the supply voltage VDD) to turn off the transistor P22 of the gate control circuit 23. The transistor P21 couples the third terminal 233 to a higher voltage (e.g., the supply voltage VDD) which turns on the transistor N22. The gate of the transistor N21 and the gate of the transistor N22 have the same potential. The turned-on transistors N21 and N22 of the ESD bypass element 22 provide a low-impedance path between the power rails (i.e., the supply voltage VDD and the supply voltage VSS). The transistor N21 and the transistor N22 are configured to discharge an ESD current between the supply voltage VDD and the supply voltage VSS. The ESD bypass element 22 is configured to clamp the ESD across the power rails. The power clamp device 120 can protect internal circuits from ESD damage.

In normal operating conditions, the voltage at the input terminal nn1 is relatively high (e.g., coupled to the supply voltage VDD) to turn off the transistor P21 and the voltage of the output terminal nn2 is relatively low (e.g., coupled to the supply voltage VSS) to turn on the transistor P22 of the gate control circuit 23. The turned-off transistor P21 acts as a resistor with a relatively large resistance. The voltage of the terminal 241 is forced to the third terminal 233 via the turned-on transistor P22. Because of the voltage ladder 24, the third terminal 233 is only coupled to the voltage at the terminal 241, rather than the supply voltage VSS. As such, the voltage at the gate of the transistor N22 is different from the voltage (i.e., the supply voltage VSS) at the gate of the transistor N21. For example, the voltage at the gate of the transistor N22 is higher than the voltage at the gate of the transistor N21. The smaller voltage difference across the gate and the source of the transistor N22 further reduces the standby leakage, e.g., the subthreshold leakage current when the power clamp device 120 is kept off. The gate control circuit 23 optimizes the gate voltage (or the gate potential) to minimize the leakage current in normal operation status. The power consumption of the power clamp device 120 is thus improved with no sacrifice of the capacity of the discharge of the ESD current.

Figure 5:
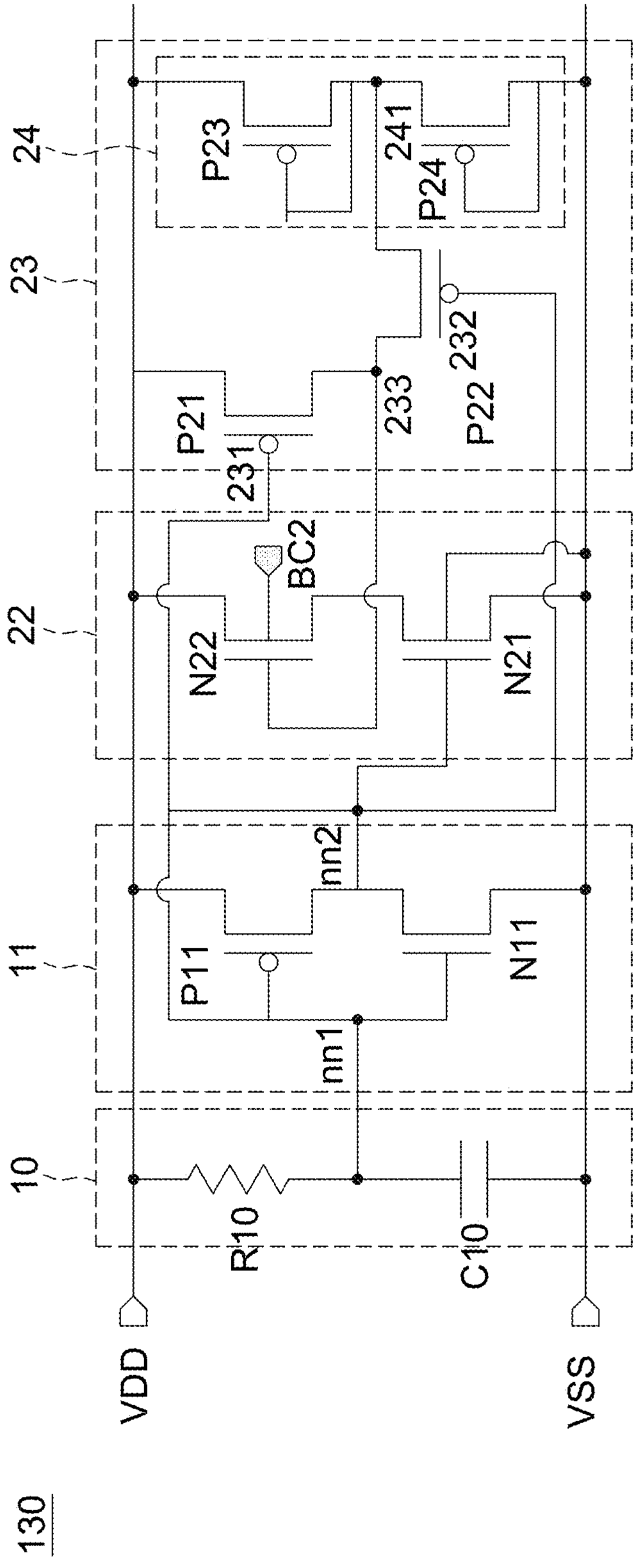
FIG. 5 is a schematic diagram of a power clamp device in accordance with some embodiments of the present disclosure.

FIG. 5 is a schematic diagram of a power clamp device 130 in accordance with some embodiments of the present disclosure. The power clamp device 130 of FIG. 5 is similar to the power clamp device 120 of FIG. 4. The difference therebetween will be discussed in detail.

The bulk of the transistor N22 of the ESD bypass element 22 is controlled by a bulk control signal BC2 transmitted by a bulk control circuit (not shown). In some embodiments, the power clamp device 130 may be formed in a silicon-on-insulator (SOI) substrate, and a conductive pad on a backside surface of the SOI substrate may be connected to the bulk of the transistor N22. The bulk control signal BC2 may be biased on the conductive pad on the backside surface of the SOI substrate and transmitted to the bulk of the transistor N22. The bulk control signal BC2 can be set to increase the voltage difference across the source and the bulk of the transistor N22. For example, the bulk control signal BC2 may be lower than the supply voltage VSS. The bulk control signal BC2 enhances the self-reverse bias effect of the cascaded structure of the ESD bypass element 22. As such, the standby leakage of the power clamp device 130 can be further reduced.

Figure 6:
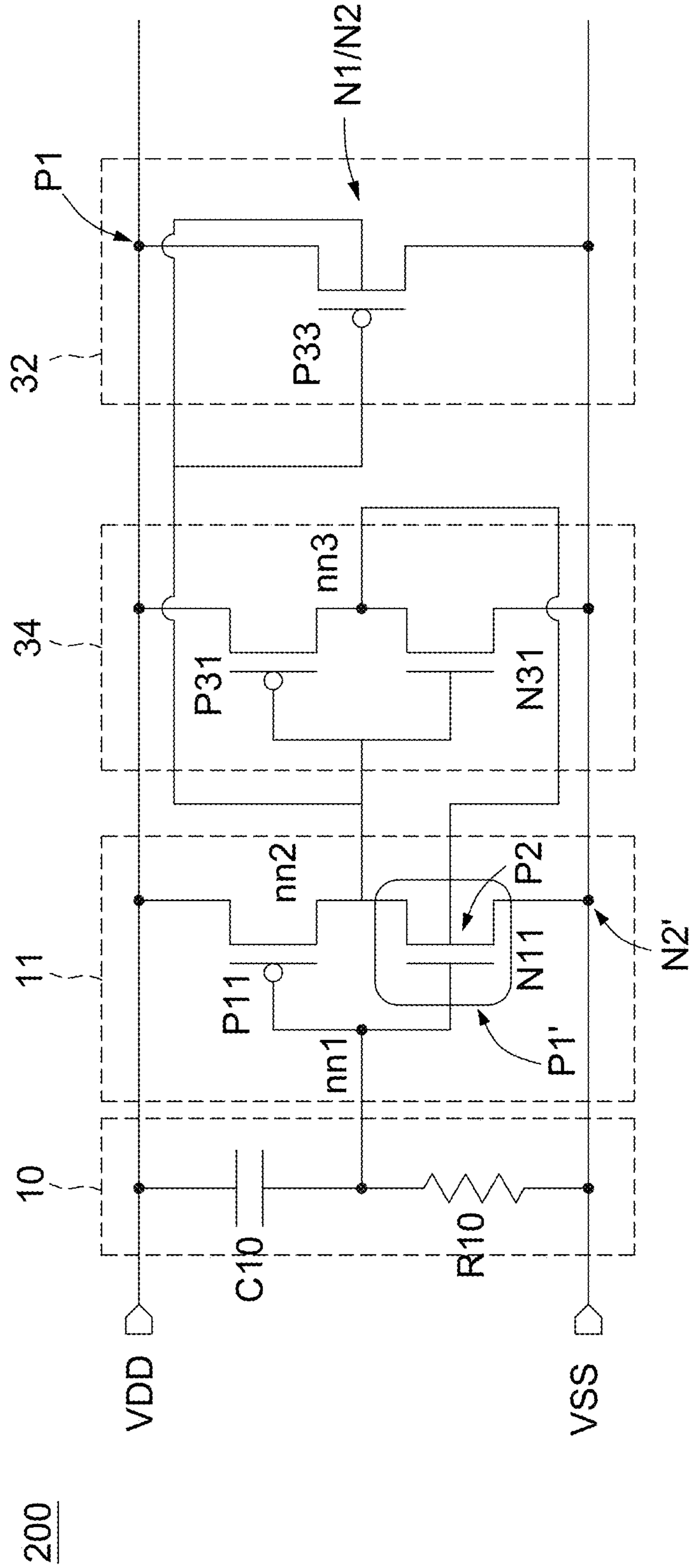
FIG. 6 is a schematic diagram of a power clamp device in accordance with some embodiments of the present disclosure.

FIG. 6 is a schematic diagram of a power clamp device 200 in accordance with some embodiments of the present disclosure. The power clamp device 200 may be connected to internal circuits and configured to protect the internal circuits in the case that an ESD event occurs. The power clamp device 200 may be configured to clamp an ESD overstress voltage across power rails. The power clamp device 200 is biased by an ESD energy and provides a low-impedance path between power rails (e.g., the supply voltage VDD and the supply voltage VSS) to bypass an ESD current. The ESD current can be efficiently discharged through the power clamp device 200.

The power clamp device 200 includes the transient detector 10, the delay element 11, an ESD bypass element 32, and a well control circuit 34. The transient detector 10 in FIG. 6 is the same as the transient detector 10 in FIG. 2 and the delay element 11 in FIG. 6 is the same as the delay element in FIG. 2, and thus a detailed description thereof is omitted for brevity.

The well control circuit 34 has an input terminal (also denoted as nn2 for brevity) electrically connected to the output terminal nn2 of the delay element 11 and an output terminal (or a node) nn3 electrically connected to a bulk terminal (also denoted as nn3 for brevity) of the delay element 11. The bulk terminal may be a p-type bulk of the transistor N11 of the delay element 11. The well control circuit 34 includes an inverter including a p-type transistor P31 and an n-type transistor N31. The transistor P31 may include a p-type MOS field-effect transistor (FET). The transistor N31 may include an n-type MOSFET. The transistor P31 has a gate electrically connected to the output terminal nn2 of the delay element 11, a source electrically connected to the supply voltage VDD, and a drain electrically connected to a drain of the transistor N31 at the node nn3. The transistor N31 has a gate electrically connected to the output terminal nn2 of the delay element 11, a source electrically connected to the supply voltage VSS, and the drain electrically connected to the source of the transistor P31.

The transient detector 10 and the delay element 11 are configured to turn on the ESD bypass element 32 under ESD overstress and turn off the ESD bypass element 32 under normal power-on conditions.

The ESD bypass element 32 is configured to clamp an ESD overstress voltage across power rails (i.e., the supply voltage VDD and the supply voltage VSS). The ESD bypass element 32 is biased by an ESD energy and provides a low-impedance path between the power rails (e.g., the supply voltage VDD and the supply voltage VSS) to bypass an ESD current. The ESD current can be efficiently discharged through the ESD bypass element 32.

The ESD bypass element 32 includes a p-type transistor P33. The p-type transistor P33 may include a p-type MOSFET. The transistor P33 may include a BIGFET. The transistor P33 has a gate electrically connected to the output terminal nn2 of the delay element 11, a source electrically connected to the supply voltage VDD, a drain electrically connected to the supply voltage VSS, and a bulk electrically connected to the output terminal nn2 of the delay element 11.

In the case that an ESD event occurs (i.e., an ESD condition), an ESD voltage across the supply voltage VDD and VSS will charge the capacitor C10 to change the voltage at the node (or the input terminal of the transient detector 10) nn1. In other words, the voltage at the node nn1 is coupled to the power rail VDD via the capacitor C10. As such, the transistor N11 of the delay element 11 is turned on and the voltage at the output terminal nn2 is forced to a lower voltage (e.g., the reference voltage VSS). The delay element 11 subsequently turns on the transistor P33 of the ESD bypass element 32. The voltage of the bulk of the transistor P33 of the ESD bypass element 32 is relatively low when the output terminal nn2 has a lower voltage (e.g., the supply voltage VSS). The turned-on transistor P33 of the ESD bypass element 32 provides a low-impedance path between the power rails (i.e., the supply voltage VDD and the supply voltage VSS). The transistor P33 is configured to discharge an ESD current between the supply voltage VDD and the supply voltage VSS. The ESD bypass element 32 is configured to clamp the ESD across the power rails. The power clamp device 200 can protect internal circuits from ESD damage.

When the voltage at the output terminal nn2 is forced to a lower voltage (e.g., the reference voltage VSS), the delay element 11 turns on the transistor P31 of the well control circuit 34. As such, the output terminal nn3 of the well control circuit 34 is coupled to the supply voltage VDD via the transistor P31. The bulk of the transistor N11 is electrically connected to a higher voltage (e.g., the supply voltage VDD) via the well control circuit 34.

The well control circuit 32 and the connection from the output terminal nn2 to the bulk of the transistor P31 of the ESD bypass element 32 introduce an embedded silicon controlled rectifier (SCR) or a PNPN structure having an anode at the source of the p-type transistor P33 of the ESD bypass element 32 and a cathode at the source of the n-type transistor N11 of the ESD delay element 11. The SCR has a parasitic PNP bipolar junction transistor (BJT) and a parasitic NPN BJT stacked next to each other. As shown in FIG. 6, the PNP BJT includes the p-type source P1 of the transistor P33 of the ESD bypass element 32, the n-type bulk N1 of the transistor P33 of the ESD bypass element 32, and a p-type ring region P1' of the transistor N11 of the delay element 11. Since the n-type bulk of the transistor P33 of the ESD bypass element 32 is biased at a relatively low voltage, i.e., the same potential of the node nn2, the PNP BJT is forward-biased. The NPN BJT includes the n-type bulk N2 of the transistor P33 of the ESD bypass element 32, the p-type bulk P2 of the transistor N11 of the delay element 11, and the n-type source N2' of the transistor N11 of the delay element 11. Since the p-type bulk of the transistor N11 of the delay element 11 is biased at a relatively high voltage, i.e., the same potential of the node nn3, the NPN BJT is forward-biased. In some embodiments, the source N1 of the transistor P33, the bulk N1/N2 of the transistor P33, a ring region P1' of the transistor N11 of the delay element 11, the bulk P2 of the transistor N1 of the delay element 11, and the source N2' of the transistor N1 of the delay element 11 form the SCR. As such, the forward-biased parasitic PNP BJT and NPN BJT of the SCR P1-N1-P1'/P2-N2-P2' provide an extra low-impedance path between the power rails (i.e., the supply voltage VDD and the supply voltage VSS). The capacity of discharging the ESD current of the power clamp device 200 is improved.

In normal operating conditions, the rise time of the normal voltage across the power rails is slower than the ESD voltage. As such, the transient detector 10 with a time constant (e.g., in the order of a microsecond) can follow the change of the normal voltage across the power rails in time.

The transistor P11 of the delay element 11 is thus turned on to keep the voltage at the output terminal nn2 at a voltage of the supply voltage VDD to turn off the transistor P33 of the ESD bypass element 32. The n-type bulk N1/N2 of the transistor P33 of the ESD bypass element 32 is kept at a higher voltage (e.g., coupled to the supply voltage VDD). When the node nn2 is at the voltage of the supply voltage VDD, the transistor N31 is turned on and the output terminal nn3 of the well control circuit 34 is coupled to the supply voltage VSS (e.g., a lower voltage). Subsequently, the p-type bulk P2 of the transistor N11 of the delay element 11 is kept at the lower voltage. The parasitic PNP BJT and NPN BJT of the SCR P1-N1-P1'/P2-N2-P2' are reversed-biased to avoid a latch-up during the normal operating conditions. The holding voltage of the SCR can thus be kept at a required value, e.g., 1.5*an operational voltage (e.g., the supply voltage VDD) or more.

Figure 7:
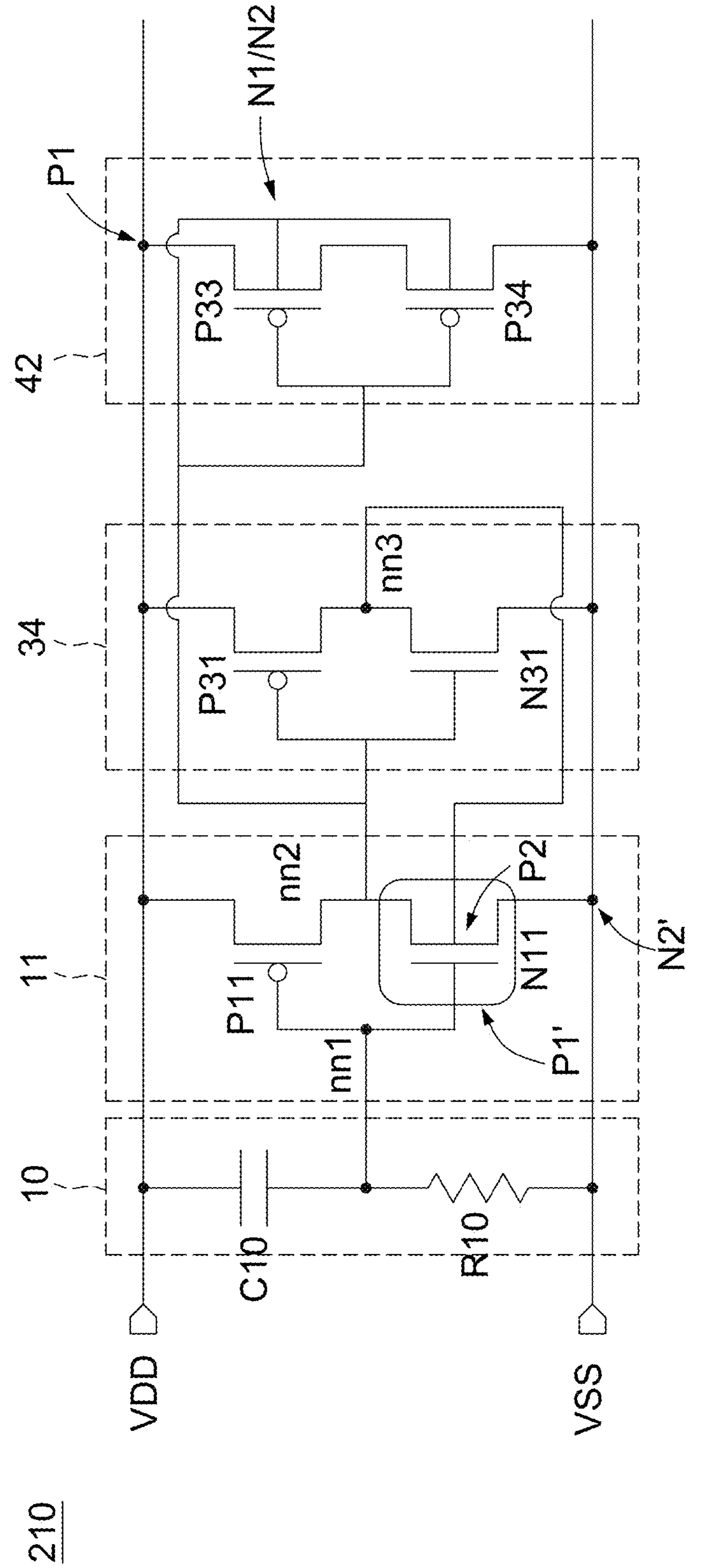
FIG. 7 is a schematic diagram of a power clamp device in accordance with some embodiments of the present disclosure.

FIG. 7 is a schematic diagram of a power clamp device 210 in accordance with some embodiments of the present disclosure. The power clamp device 210 of FIG. 7 is similar to the power clamp device 200 of FIG. 6. The difference therebetween will be discussed in detail.

The power clamp device 220 includes an ESD bypass element 42. The ESD bypass element 42 includes a cascaded structure including a p-type transistor P33 and a p-type transistor P34. The transistor P33 in FIG. 7 is the same as the transistor P33 in FIG. 6, and thus a detailed description thereof is omitted for brevity.

The transistor P34 has a gate electrically connected to the output terminal nn2 of the delay element 11, a source electrically connected to the drain of the transistor P33, a drain electrically connected to supply voltage VSS, and a bulk electrically connected to the bulk of the transistor P33 and the output terminal nn2 of the delay element 11.

The cascaded structure of the transistors P33 and P34 of the ESD bypass element 42 can reduce the standby leakage current in the normal operating conditions. For example, the cascaded structure can reduce the subthreshold leakage current of the ESD bypass element 42 due to the stack effect or self-reverse bias effect. In particular, a reverse bias across the source and the bulk of the transistor P34 can reduce the subthreshold leakage current. In some embodiments, the ESD bypass element 42 may include more transistors in stack.

Similar to the operation of the power clamp device 200 in FIG. 6, in the case that an ESD event occurs, the transistors P33 and P34 provide a low-impedance path between the power rails (e.g., the supply voltage VDD and the supply voltage VSS) to bypass an ESD current. The transistor P33 and the transistor P34 are configured to discharge an ESD current between the supply voltage VDD and the supply voltage VSS. The forward-biased parasitic PNP BJT and NPN BJT of the SCR P1-N1-P1'/P2-N2-P2' provide an extra low-impedance path between the power rails (i.e., the supply voltage VDD and the supply voltage VSS). The capacity of discharging the ESD current of the power clamp device 210 is improved.

In normal operating conditions, the n-type bulk of the transistor P33 and the n-type bulk of the transistor P34 of the ESD bypass element 32 is kept at a higher voltage (e.g., coupled to the supply voltage VDD). The p-type bulk P2 of the transistor N11 of the delay element 11 is kept at a lower voltage. The parasitic PNP BJT and NPN BJT of the SCR P1-N1-P1'/P2-N2-P2' are reversed-biased to avoid a latch-up during the normal operating conditions. The holding voltage of the SCR can thus be kept at a required value, e.g., 1.5*operational voltage or more.

Figure 8:
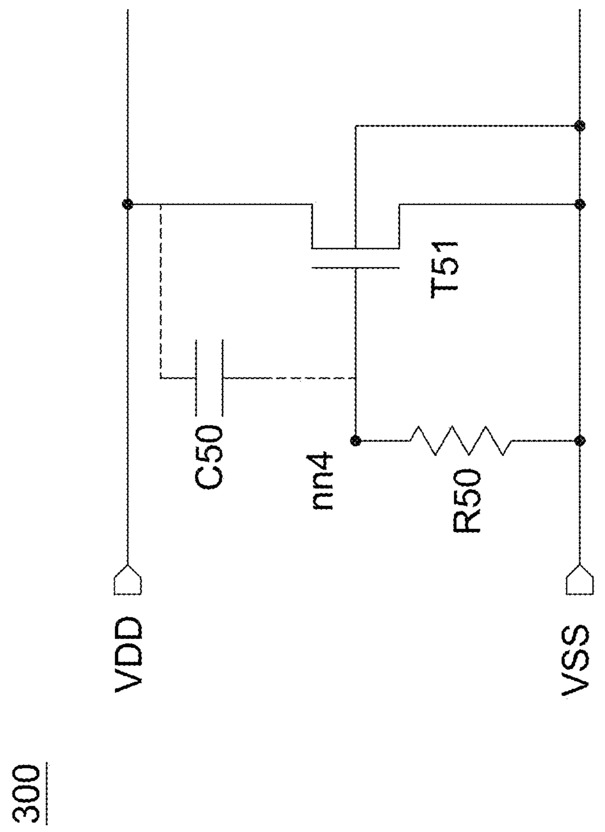
FIG. 8 is a schematic diagram of a power clamp device in accordance with some embodiments of the present disclosure.

FIG. 8 is a schematic diagram of a power clamp device 300 in accordance with some embodiments of the present disclosure. The power clamp device 300 may be connected to internal circuits and configured to protect the internal circuits in the case that an ESD event occurs. The power clamp device 300 may be configured to clamp an ESD overstress voltage across power rails. The power clamp device 300 is biased by an ESD energy and provides a low-impedance path between power rails (e.g., the supply voltage VDD and the supply voltage VSS) to bypass an ESD current. The ESD current can be efficiently discharged through the power clamp device 300.

The power clamp device 300 includes a resistor R50 and an n-type transistor 51. The resistor R50 is electrically connected to a supply voltage (or a reference voltage) VSS. The resistor R50 is electrically connected to the transistor T51 at a node nn4. The resistor R50 may include a solder-mounted technology (SMT) resistor. The resistor R50 may include a transistor-based resistor. For example, the resistor R50 may include a diode-connected transistor. The transistor T51 may include an n-type lateral diffusion (LD) MOSFET. The transistor T51 may include a gate electrically connected to the resistor R50 at the node nn4, a source electrically connected to the supply voltage VSS, a drain electrically connected to a supply voltage VDD, and a bulk electrically connected to the supply voltage VSS.

Figure 9:
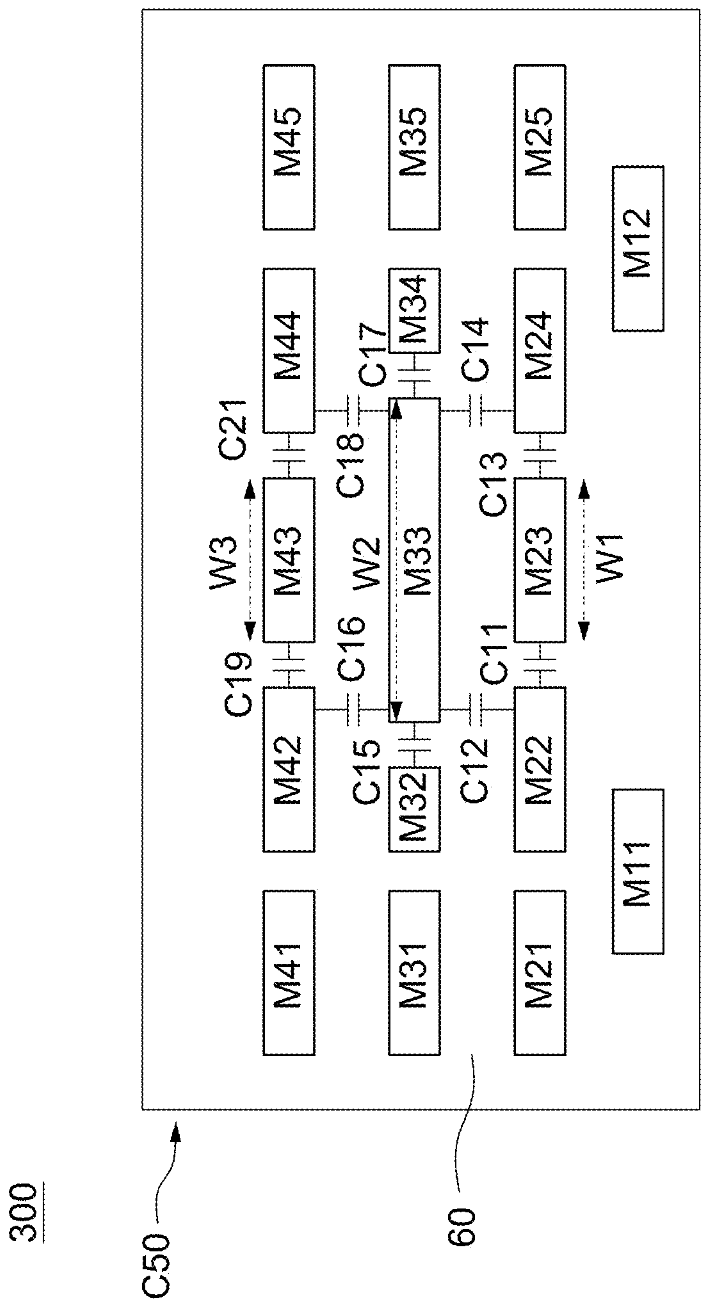
FIG. 9 is a schematic diagram of metal-oxide-metal (MOM) capacitors of a power clamp device in accordance with some embodiments of the present disclosure.

The backend routing of metal layers and insulating material therebetween may provide a plurality of parasitic capacitors, for example, the parasitic capacitors between the gate and drain of the transistor T51. The present disclosure provides a structure utilizing and increasing the parasitic capacitors, and thus no individual capacitor (e.g., the capacitor C10 in FIG. 2) is required. The power clamp device 300 further includes a capacitance component C50 electrically connected between the gate and the drain of the transistor (or the LDMOSFET) T51. The capacitance component C50 is realized by the backend metal routing of metal layers. The capacitance component 50 may include parasitic capacitors between the gate and drain of the transistor T51. The capacitance component C50 may include a plurality of metal-oxide-metal (MOM) capacitors. FIG. 9 is a schematic diagram of MOM capacitors of the power clamp device 300 in accordance with some embodiments of the present disclosure.

As shown in FIG. 9, the MOM capacitors of the capacitance component C50 include a plurality of metal layers M22, M23, M24, M32, M33, M34, M42, M43, and M44 surrounded by insulating material (or oxide material, dielectric material) 60. The metal layers M22, M23, M24, M32, M33, M34, M42, M43, and M44 are separated by each other with the insulating material 60. The metal layers M22, M23, and M24 are at the same elevation level. The metal layers M22, M23, and M24 can be formed in the same manufacturing process. The metal layers M32, M33, and M34 are at the same elevation level. The metal layers M32, M33, and M34 can be formed in the same manufacturing process. The metal layers M42, M43, and M44 are at the same elevation level. The metal layers M42, M43, and M44 can be formed in the same manufacturing process. The metal layers M42, M43, and M44 are disposed above the metal layers M32, M33, and M34. The metal layers M32, M33, and M34 are disposed above the metal layers M22, M23, and M24.

There is a plurality of metal layers M11 and M12 below the MOM capacitors of the capacitance component C50. The metal layers M11 and M12 may be electrically connected to the gate of the transistor T51. There is a plurality of metal layers M21, M25, M31, M35, M41, and M45 surrounding the MOM capacitors of the capacitance component C50. The metal layers M21, M25, M31, M35, M41, and M45 may be electrically connected to the source of the transistor T51.

The metal layers M22, M32, M42, M24, M34, and M44 are electrically connected to the gate of the transistor T51 or the node nn4. The metal layers M23, M33, and M43 are electrically connected to the drain of the transistor T51 or the node nn4. The potential of the metal layers M22, M32, M42, M24, M34, and M44 is different from that of the metal layers M23, M33, and M43.

The metal layer M23 has a width W1 and the metal layer M33 has a width W2. The width W2 is greater than the width W1. The metal layer M33 overlaps the metal layer M22 and the metal layer M23. The metal layer M22, the metal layer M23, and a portion of the insulating material 60 form a MOM capacitor C11. The metal layer M22, the metal layer M33, and a portion of the insulating material 60 form a MOM capacitor C12. The MOM capacitor C11 has an electrical field direction and the MOM capacitor C12 has an electrical field direction perpendicular to the electrical field direction of the MOM capacitor C11. The metal layer M23, the metal layer M24, and a portion of the insulating material 60 form a MOM capacitor C13. The metal layer M24, the metal layer M33, and a portion of the insulating material 60 form a MOM capacitor C14. The MOM capacitor C13 has an electrical field direction and the MOM capacitor C14 has an electrical field direction perpendicular to the electrical field direction of the MOM capacitor C13.

The metal layer M32, the metal layer M33, and a portion of the insulating material 60 form a MOM capacitor C15. The metal layer M34, the metal layer M33, and a portion of the insulating material 60 form a MOM capacitor C17. The electrical field directions of the MOM capacitors C15 and C17 are substantially the same.

The metal layer M43 has a width W3. The width W2 is greater than the width W3. The metal layer M33 overlaps the metal layer M42 and the metal layer M43. The metal layer M42, the metal layer M43, and a portion of the insulating material 60 form a MOM capacitor C19. The metal layer M42, the metal layer M33, and a portion of the insulating material 60 form a MOM capacitor C16. The MOM capacitor C19 has an electrical field direction and the MOM capacitor C16 has an electrical field direction perpendicular to the electrical field direction of the MOM capacitor C19. The metal layer M43, the metal layer M44, and a portion of the insulating material 60 form a MOM capacitor C21. The metal layer M44, the metal layer M33, and a portion of the insulating material form a MOM capacitor C18. The MOM capacitor C21 has an electrical field direction and the MOM capacitor C18 has an electrical field direction perpendicular to the electrical field direction of the MOM capacitor C21.

In some embodiments, the electrical field directions of the MOM capacitors C11, C13, C15, C17, C19, and C21 may be substantially the same. In some embodiments, the electrical field directions of the MOM capacitors C12, C14, C16, and C18 may be substantially the same.

The capacitance component C50 has a capacitance equal to the total capacitance of the plurality of MOM capacitors C11-C21. Referring again to FIG. 8, the capacitance component C50 and the resistor R50 act as a transient detector, which can detect an ESD event (e.g., an ESD current or an ESD pulse). The capacitance of the capacitance component C50 can be adjusted to provide a suitable time constant for the transient ESD detection.

In the case that an ESD event occurs (i.e., an ESD condition), an ESD voltage across the supply voltage VDD and VSS will charge the capacitance component C50 (e.g., the MOM capacitors C11-C21 in FIG. 9) to change the voltage at the node nn4. The voltage at the node nn4 is coupled to the power rail VDD via the capacitance component C50, and the transistor T51 is subsequently turned on. The turned-on transistor T51 provides a low-impedance path between the power rails (i.e., the supply voltage VDD and the supply voltage VSS. The transistor T51 is configured to clamp the ESD across the power rails. The power clamp device 300 can protect internal circuits from ESD damage.

In normal operating conditions, the rise time of the normal voltage across the power rails is slower than the ESD voltage. As such, the resistor R50 and the capacitance component C50 with a time constant (e.g., in the order of a microsecond) can follow the change of the normal voltage across the power rails in time. The voltage at the node nn4 equal to the supply voltage VSS to turn off the transistor T51. The power clamp device 300 provides an ESD discharge path with no influence of the normal operation of internal circuits.

Figure 10:
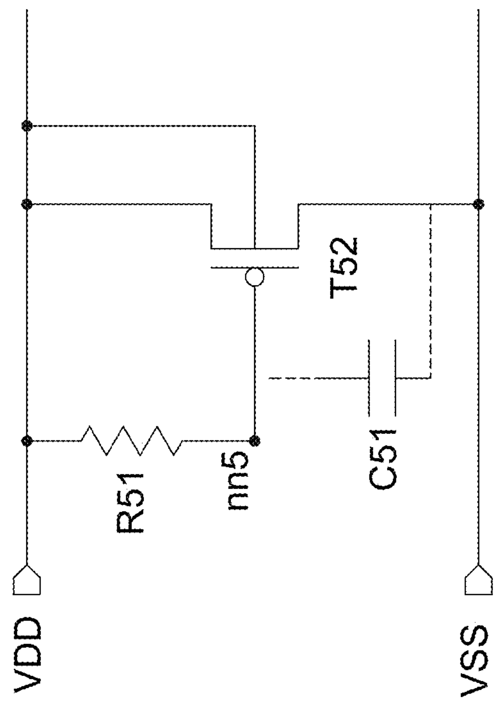
FIG. 10 is a schematic diagram of a power clamp device in accordance with some embodiments of the present disclosure.

FIG. 10 is a schematic diagram of a power clamp device 310 in accordance with some embodiments of the present disclosure. The power clamp device 300 includes a resistor R51 and a p-type transistor 52. The resistor R51 is electrically connected to a supply voltage (or a reference voltage) VSS. The resistor R51 is electrically connected to the transistor T52 at a node nn5. The resistor R51 may include a solder-mounted technology (SMT) resistor. The resistor R51 may include a transistor-based resistor. For example, the resistor R51 may include a diode-connected transistor. The transistor T52 may include a p-type LDMOSFET. The transistor T52 may include a gate electrically connected to the resistor R51 at the node nn5, a source electrically connected to the supply voltage VDD, a drain electrically connected to a supply voltage VSS, and a bulk electrically connected to the supply voltage VDD.

The power clamp device 310 further includes a capacitance component C51 between the gate and the drain of the transistor T52. The capacitance component C51 in FIG. 10 is similar to the capacitance component C50 in FIGS. 8 and 9, and thus a detailed description thereof is omitted for brevity.

In the case that an ESD event occurs (or the ESD condition), the node nn5 is forced to a lower voltage (e.g., the supply voltage VSS) to turn on the transistor T52. The turned-on transistor T52 provides a low-impedance path between the power rails (i.e., the supply voltage VDD and the supply voltage VSS). The transistor T52 is configured to discharge an ESD current between the supply voltage VDD and the supply voltage VSS. The transistor T52 is configured to clamp the ESD across the power rails. The power clamp device 310 can protect internal circuits from ESD damage.

In normal operating conditions, the voltage at the node nn5 is relatively high (e.g., coupled to the supply voltage VDD) to turn off the transistor T52. The power clamp device 310 would not influence the normal operation of the internal circuits.

The present disclosure provides a power clamp device. The power clamp device includes a delay element, a first transistor, a second transistor, and a gate control circuit. The delay element has an input terminal and an output terminal. The first transistor has a gate electrically connected to the output terminal of the delay element. The second transistor has a source electrically connected to a drain of the first transistor. The gate control circuit has a first terminal electrically connected to the input terminal of the delay element, a second terminal electrically connected to the output terminal of the delay element, and a third terminal electrically connected to a gate of the second transistor.

The present disclosure provides a power clamp device. The power clamp device includes a delay element, a first transistor, and a well control circuit. The delay element has an input terminal, an output terminal, and a bulk terminal. The first transistor has a gate electrically connected to the output terminal of the delay element. The well control circuit has a first terminal electrically connected to a bulk of the first transistor, and a second terminal electrically connected to the bulk terminal of the delay element.

The present disclosure provides a power clamp device. The power clamp device includes a resistor, a lateral diffusion metal-oxide-semiconductor field-effect transistor (LDMOSFET), and a capacitance component. The LDMOSFET has a gate electrically connected to the resistor, a drain electrically connected to a first power supply, and a source electrically connected to a second power supply. In the case that an ESD event occurs, the LDMOSFET is configured to discharge an ESD current between the first supply voltage and the second supply voltage. The capacitance component is electrically connected between the gate and the drain of the LDMOSFET. The capacitance component includes a plurality of metal-oxide-metal (MOM) capacitors.

Moreover, the scope of the present application in not intended to be limited to the particular embodiments of the process, machine, manufacture, and composition of matter, means, methods and steps described in the specification. As those skilled in the art will readily appreciate from the disclosure of the present disclosure, processes, machines, manufacture, composition of matter, means, methods or steps presently existing or later to be developed, that perform substantially the same function or achieve substantially the same result as the corresponding embodiments described herein may be utilized according to the present disclosure.

Accordingly, the appended claims are intended to include within their scope such as processes, machines, manufacture, compositions of matter, means, methods or steps. In addition, each claim constitutes a separate embodiment, and the combination of various claims and embodiments are within the scope of the present disclosure.

What is claimed is:

1. A power clamp device, comprising:

a delay element having an input terminal and an output terminal;

an electrostatic discharge (ESD) bypass element having a first terminal and a second terminal, wherein the first terminal is electrically connected to the output terminal of the delay element; and a gate control circuit having a first terminal electrically connected to the input terminal of the delay element, a second terminal electrically connected to the output terminal of the delay element, and a third terminal electrically connected to the second terminal of the ESD bypass element, wherein the gate control circuit comprises a third transistor having a gate acting as the first terminal of the gate control circuit, and a fourth transistor having a gate acting as the second terminal of the gate control circuit, wherein the third transistor is connected to the fourth transistor at the third terminal of the gate control circuit, and the gate control circuit comprises a voltage ladder electrically connected to the fourth transistor.

2. The power clamp device of claim 1, wherein the ESD bypass element is electrically connected between a first supply voltage and a second supply voltage, and wherein, in the case that an ESD event occurs, the ESD bypass element is configured to discharge an ESD current between the first supply voltage and the second supply voltage.

3. The power clamp device of claim 1, wherein, in the case that an ESD event occurs, the third transistor of the gate control circuit is on and the fourth transistor of the gate control circuit is off.

4. The power clamp device of claim 3, wherein, in the case that no ESD event occurs, the third transistor of the gate control circuit is off and the fourth transistor of the gate control circuit is on.

5. The power clamp device of claim 1, wherein, in the case that an ESD event occurs, the first terminal and the second terminal of the ESD bypass element have the same potential.

6. The power clamp device of claim 5, wherein, in the case that no ESD event occurs, the first terminal of the ESD bypass element has a potential different from that of the second terminal of the ESD bypass element.

7. The power clamp device of claim 1, wherein the ESD bypass element comprises a first transistor having a first bulk electrically connected to a supply voltage and a second transistor having a second bulk configured to be controlled by a bulk control signal.

8. The power clamp device of claim 1, further comprising a transient detector electrically connected to the input terminal of the delay element.

9. The power clamp device of claim 1, wherein the delay element includes at least one inverter.

10. A power clamp device, comprising:

a delay element having an input terminal, an output terminal, and a bulk terminal;

an ESD bypass element electrically connected to the output terminal of the delay element; and a well control circuit has a first terminal electrically connected to the ESD bypass element, and a second terminal electrically connected to the bulk terminal of the delay element, wherein the delay element includes a first transistor having a gate connected to the input terminal of the delay element, a drain connected to the output terminal of the delay element, a source connected to a second supply voltage, and a bulk connected to the bulk terminal of the delay element, and wherein the ESD bypass element has a first terminal connected to a first supply voltage and a second terminal connected to the well control circuit, and wherein the first terminal of the ESD bypass element, the second terminal of the ESD bypass element, a ring region of the first transistor, the bulk of the first transistor, and the source of the first transistor form a silicon controlled rectifier (SCR).

11. The power clamp device of claim 10, wherein the ESD bypass element is electrically connected to a first supply voltage and a second supply voltage, and wherein, in the case that an ESD event occurs, the ESD bypass element is configured to discharge an ESD current between the first supply voltage and the second supply voltage.

12. The power clamp device of claim 11, wherein the ESD bypass element comprises a cascaded structure, wherein, in the case that an ESD event occurs, the cascaded structure is configured to discharge an ESD current between the first supply voltage and the second supply voltage.

13. A power clamp device, comprising:

a lateral diffusion metal-oxide-semiconductor field-effect transistor (LDMOSFET) having a gate, a drain electrically connected to a first supply voltage, and a source electrically connected to a second supply voltage, wherein, in the case that an ESD event occurs, the LDMOSFET is configured to discharge an ESD current between the first supply voltage and the second supply voltage; and a capacitance component electrically connected between the gate and the drain of the LDMOSFET, wherein the capacitance component includes a plurality of metal-oxide-metal (MOM) capacitors, wherein the MOM capacitors have a first metal layer, a second metal layer at the same elevation level of the first metal layer, and a third metal layer disposed above the first metal layer and the second metal layer.

14. The power clamp device of claim 13, wherein the first metal layer, the second metal layer, and a first portion of an insulating material form a first MOM capacitor of the MOM capacitors, and wherein the first metal layer, the third metal layer and a second portion of the insulating material form include a second MOM capacitor of the MOM capacitors.

15. The power clamp device of claim 14, wherein the second metal layer has a first width and the third metal layer has a second width greater than the first width of the second metal layer.

16. The power clamp device of claim 15, wherein the first MOM capacitor has a first electrical field direction and the second MOM capacitor has a second electrical field direction substantially perpendicular to the first electrical field direction.

17. The power clamp device of claim 1, wherein the ESD bypass element comprises a first type transistor and the gate control circuit comprises a second type transistor opposite to the first type transistor.

18. The power clamp device of claim 1, wherein the voltage ladder comprises a plurality of transistors that are diode-connected to act as a resistor.

19. The power clamp device of claim 10, further comprising a conductive pad on a backside surface of a silicon-on-insulator (SOI) substrate, wherein the well control circuit is configured to provide a signal to the conductive pad.

20. The power clamp device of claim 10, wherein the well control circuit comprises an inverter.

* * * * *